United States Patent
Hatanaka

(10) Patent No.: US 6,794,863 B2
(45) Date of Patent: Sep. 21, 2004

(54) MAGNETIC FIELD SENSOR, METHOD FOR DETECTING MAGNETIC FIELD AND DEVICE FOR DETECTING MAGNETIC FIELD

(75) Inventor: Tadata Hatanaka, Yokohama (JP)

(73) Assignee: Matsushta Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/706,279

(22) Filed: Nov. 13, 2003

(65) Prior Publication Data

US 2004/0130317 A1 Jul. 8, 2004

(30) Foreign Application Priority Data

Nov. 13, 2002 (JP) ........................................ 2002-329535

(51) Int. Cl.⁷ .............................................. G01R 33/07
(52) U.S. Cl. .................................... 324/251; 324/207.2
(58) Field of Search ........................... 324/251, 207.11, 324/207.13, 207.2, 207.21, 207.22, 207.23–207.26

(56) References Cited

U.S. PATENT DOCUMENTS 4,037,150 A   7/1977 Taranov et al.
5,442,283 A   8/1995 Vig et al.

Primary Examiner—Bot LeDynh
(74) Attorney, Agent, or Firm—McDermott Will & Emery LLP

(57) ABSTRACT

The present invention provides a magnetic sensor with a simple configuration which detects a magnetic field strength of both polarities and which consumes a small amount of power. The magnetic field sensor of the present invention comprises a first switch part which inputs a signal outputted from a magnetoelectric element which outputs a signal corresponding to an applied magnetic field, and which outputs a signal, switching so that a polarity during a first period and a fourth period and a polarity during a second period and a third period are mutually opposite; an amplifier which amplifies an output signal of the first switch part and outputs a signal to its output terminal pair; a memory element, both ends of which are connected to the output terminal pair of the amplifier, and which holds a voltage outputted from the amplifier; a second switch part which is inserted and makes a connection between one of the output terminal and one terminal of the memory element, and which closes during the first period and the third period and opens during the second period and the fourth period; and a switch output terminal which outputs an output signal of a first polarity of the second switch part during the second period, and which outputs an output signal of a second polarity of the second switch part during the fourth period.

20 Claims, 4 Drawing Sheets

MAGNETIC FIELD SENSOR, METHOD FOR DETECTING MAGNETIC FIELD AND DEVICE FOR DETECTING MAGNETIC FIELD

BACKGROUND OF THE INVENTION

The present invention relates to a magnetic field sensor, method for detecting magnetic field and device for detecting magnetic field, capable of detecting the strength of a magnetic field without relying to the polarity of the magnetic field.

In recent years, demands for a magnetic field sensor as a position sensor such as open/close detection device or a rotation detection device which are mounted on a miniature electronic machine such as a folding-type cellular phone, a notebook personal computer and a digital still camera are rising. In regard to a magnetic field sensor which is to be mounted on a portable miniature electronic machine, its circuit scale and electric current consumption needs to be both reduced.

Generally, a magnetic sensor is monolithically integrated and configured by using a bipolar transistor, a CMOS device or the like. Such magnetic sensor has a magnetoelectric element which generates a voltage in proportion to a magnetic field or a magnetic flux density, an amplifier which amplifies the output signal of a magnetoelectric element, and a comparator which compares the output voltage of the amplifier with the pre-determined reference voltage, and outputs the judgment result of whether the strength of the magnetic field detected by the magnetoelectric element (Hereinafter described as "detected magnetic field") is larger or not compared with the pre-determined strength of the magnetic field. A Hall element which outputs a voltage corresponding to the magnetic field strength or the magnetic flux density which passes through the element, or a magnetic resistance whose resistance value varies according to the strength of the magnetic field is used as a magnetoelectric element.

In order to obtain an accurate comparison result according to the strength of the magnetic field from the magnetic field sensor, there is a need to control the offset signal contained in the signal outputted from the amplifier, and to minimize the dispersion of the signal outputted from the amplifier for each magnetic field sensor (product). There are two major factors for an offset signal to occur. One factor is an offset signal component of a magnetoelectric element due to the effect of a stress of a sealing package or the like, and the other is an input offset signal component of an amplifier.

Method for compensating the offset signal component of a magnetoelectric element is disclosed in the specification of U.S. Pat. No. 4,037,150. More specifically, of the output terminals of the magnetoelectric element having four terminals which are geometrically equal, voltage differences of the two pairs of output terminals located in a diagonal position are outputted, wherein the first phase and the second phase of the synchronizing signal which acts as a trigger for detection is alternately switched, and a sum of the output values is obtained. The effective signal component is doubled since it is in a same phase, and the offset signal component is cancelled since it is in an opposite phase.

One of the factors to determine superiority of a magnetic field sensor is whether a detection of a magnetic field is capable or not, regardless of the polarity of the magnet incorporated to a product, or in other words, corresponding to the magnetic field of both polarities. If a judgment of a magnetic field strength is capable regardless of the polarity of the magnet, controlling the direction of a magnet when placing a magnet in a position sensor or the like incorporating a magnet and a Hall IC, becomes unnecessary.

Hereinafter, a conventional magnetic field sensor judging the magnetic field strength of both polarities disclosed in the Official Gazette of Japanese Unexamined Patent Publication Hei 7-83699 is described in reference to the drawings.

FIG. 4 shows a configuration example of a conventional magnetic field strength judgment circuit of both polarities. As shown in FIG. 4, a conventional magnetic field sensor is comprised of a magnetoelectric element ("Hall element" in prior art) 101, a voltage amplifier 102 which amplifies the output voltage of the magnetoelectric element 101, a first Schmitt trigger circuit 103A which receives the output voltage from the voltage-amplifier 102 and outputs a different voltage depending on its threshold value, a second Schmitt trigger circuit 103B which receives the output voltage from the voltage amplifier, inverting the polarity of the input signal of the first Schmitt trigger circuit 103A, and a logic latch circuit 104 which receives and latches the output signal from the first Schmitt trigger circuit 103A and the second Schmitt trigger circuit 103B.

Operation of a conventional magnetic field sensor which is configured as such is described.

First, a Hall voltage which occurs at the output terminal of the magnetoelectric element 101 in proportion to the magnetic flux density passing through the magnetoelectric element 101 is amplified by the amplifier 102, and an amplified voltage VH is obtained.

Next, the first Schmitt trigger circuit 103A and the second Schmitt trigger circuit 103B input the amplified voltage VH, compares whether the value of the amplified voltage VH is larger or not than the set voltage value, and outputs the judgment value. The first Schmitt trigger circuit 103A and the second Schmitt trigger circuit 103B is an equivalent circuit, and by mutually inverting the polarity of the input signal, level detection of the magnetic field strength of the north polarity and the south polarity are performed separately in these two Schmitt trigger circuits 103A and 103B.

Then, the output value of the first Schmitt trigger circuit 103A and the second Schmitt trigger circuit 103B are inputted to the logic latch circuit 104. Subsequently, an output value is outputted from the logic latch circuit 104, wherein a certain computation is performed to the output value of the two Schmitt trigger circuits 103A and 103B corresponding to magnetic fields of the north polarity and the south polarity respectively. The output value from the logic latch circuit 104 is a binary value irrelevance to polarity of the detected magnetic field representing whether or not the strength of the detected magnetic field is larger than the strength of the set magnetic field.

However, a conventional magnetic field sensor has a difficulty wherein reducing both the circuit scale and electric current consumption is difficult, since two sets of Schmitt trigger circuit are needed as a voltage comparator circuit in order to detect a magnetic field strength regardless of the polarity of the magnetic field and corresponding to the magnetic field of both polarities.

The present invention has the purpose of providing a magnetic field sensor, a device for detecting magnetic field and a method for detecting magnetic field which solves the above-mentioned conventional problem, detecting a magnetic field strength of both polarities regardless of the polarity of the magnetic field with a simple configuration and consumes a small amount of power.

SUMMARY OF THE INVENTION

In order to solve the above-mentioned difficulties, the present invention has the following configuration. A magnetic field sensor in accordance with the present invention from one aspect is comprised of a first switch part which receives a signal corresponding to a signal of a magnetoelectric element in an applied magnetic field, and which outputs an output signal so that a polarity of the output signal in a first period and a fourth period are each opposite to a polarity of the output signal in a second period and a third period, an amplifier which amplifies the output signal of the first switch part and outputs an output signal to its output terminal pair, a first memory element of which both ends are connected to the above-mentioned output terminal pair of the amplifier, a second switch part connected between one of the above-mentioned output terminal pair and one terminal of the above-mentioned first memory element, and which closes in synchronization to the above-mentioned first period and the above-mentioned third period and opens in synchronization to the above-mentioned second period and the above-mentioned fourth period, and an output switch terminal which outputs a signal of a first polarity in the second period, and which outputs a signal of an opposite polarity to the above-mentioned first polarity in the fourth period.

A magnetic field sensor in accordance with the present invention from another aspect is comprised of a magnetoelectric element which has a first terminal pair and a second terminal pair and which outputs a signal corresponding to an applied magnetic field, a first switch part which receives a signal of the first terminal pair and a signal of the second terminal pair of the magnetoelectric element and at least one external signal which determines a first period., a second period, a third period and a fourth period, and which outputs a signal of said first terminal pair of the magnetoelectric element in the first period and the fourth period, and outputs a signal of said first second terminal pair of the magnetoelectric element in the second period and the third period, an amplifier which amplifies the output signal of the first switch part and outputs a signal to its output terminal pair, a first memory element of which both ends are connected to the above-mentioned output terminal pair of the amplifier, a second switch part connected between one of the above-mentioned output terminal pair and one terminal of the above-mentioned first memory element, and which closes in synchronization to the first period and the third period and opens in synchronization to the second period and to the fourth period, and an output switch terminal which-outputs at least one of the signals at the ends of the above-mentioned second switch part.

In this specification, the first period, the second period, the third period and the fourth period occur singly or repeatedly in this sequence.

A device for detecting magnetic field sensor in accordance with the present invention from another aspect is comprised of a first selecting-signal generator which generates a first selecting-signal during a first period and a fourth period, a second selecting-signal generator which generates a second selecting-signal during a second period and a third period, a third selecting-signal generator which generates a third selecting-signal during the first period and the third period, a magnetoelectric element which has a first terminal pair and a second terminal pair and which outputs a signal corresponding to an applied magnetic field, a first switch part which receives a signal of the first terminal pair and a signal of the second terminal pair of the magnetoelectric element, and said first selecting-signal and said second selecting-signal respectively, and which outputs a signal of said first terminal pair of the magnetoelectric element in the first period and the fourth period, and outputs a signal of said second terminal pair of the magnetoelectric element in the second period and the third period, an amplifier which amplifies the output signal of the first switch part and outputs a signal to its output terminal pair, a first memory element, both ends of which are connected to the above-mentioned output terminal pair of the amplifier, a second switch part connected between one of the above-mentioned output terminal pair and one terminal of the above-mentioned first memory element, and which receives the above-mentioned third selecting signal, and which closes in the first period and the third period and opens in the second period and the fourth period, a comparator which receives at least one of the voltages at the ends of the above-mentioned second switch part, and which outputs a result of comparison with a predetermined value, and a judgment circuit which outputs a logical sum signal of the output signal of the above-mentioned comparator in the second period and the output signal of the above-mentioned comparator in the fourth period.

A method for detecting magnetic field sensor in accordance with the present invention from one aspect is comprised of a step of receiving a signal corresponding to an applied magnetic field, outputted from a magnetoelectric element, and outputting an output signal so that a polarity of the output signal in a first period and a fourth period opposites to a polarity of the signal during a second period and a third period, an amplifying step of amplifying and outputting the output signal, a holding step of holding the output signal outputted in the above-mentioned amplifying step in a first memory element, in the first period and the third period, an addition step of adding-signal components of an output signal outputted in the above-mentioned amplifying step and the output signal stored in the above-mentioned first memory element, in the second period and the fourth period, a comparison step of receiving the added signal components of the above-mentioned addition step in the second period and the fourth period, and outputting a result of comparison with a predetermined value, and a judgment step of outputting a logical sum of the output signal of the above-mentioned comparison step in the second period and the period.

By having such configuration, the present invention is capable of removing the offset voltage contingent to the amplifier and extracting the output signal of the magnetoelectric element, as well as removing an offset voltage component which occurs at the output of a magnetoelectric element, using the structural symmetry of a magnetoelectric element.

Existence of a signal can be judged whether the polarity of the magnetic field is a north pole or a south pole.

In the above-mentioned magnetic sensor in accordance with the present invention from another aspect, the above-mentioned second switch part comprises an output terminal pair.

A magnetic field sensor in accordance with the present invention from another aspect further comprises a comparator, which receives the signal of said output switch terminal, and outputs a result of comparison with a predetermined value. By having a comparator which inputs the signal of a switch output terminal and outputs the result compared with the predetermined value, the magnetic field sensor outputs a highly precise binary value.

In the above-mentioned magnetic sensor in accordance with the present invention from another aspect, a different voltage is appended to the signal of said output switch terminal, corresponding to the output signal of said comparator. From this configuration, a hysteresis can be provided to the comparator, and magnetic field or a magnetic flux density can be detected with stability.

Furthermore, in the above-mentioned magnetic sensor in accordance with the present invention from another aspect, one end of said second switch part is connected to one of the input terminal pair of the comparator, and the other end of said second switch part is connected to the other said input terminal pair of the comparator via a second memory element. A threshold value can be stored in the second memory element, and a threshold can be set in the comparator in a simple configuration.

The above-mentioned magnetic sensor in accordance with the present invention from another aspect further comprises a third switch part, one end of which is connected to one end of said second memory element, a fourth switch part, one end of which is connected to the other end of said second memory element, a first voltage source which applies a first voltage to the other end of said third switch part, and a second voltage source which applies a voltage different from said first voltage to the other end of said fourth switch part, wherein said third switch part and the fourth switch part are closed in said first and fourth period. Thus a threshold value can be stored in the second memory element, and a threshold can be set in the comparator in a simple configuration.

In the above-mentioned magnetic sensor in accordance with the present invention from another aspect, either one of said first voltage or said second voltage is changed corresponding to said external signal. By appending a different voltage corresponding to the output signal of the comparator to the signal of the switch output terminal, the magnetic field sensor is capable of detection in which a hysteresis is appended.

In the above-mentioned magnetic sensor in accordance with the present invention from another aspect, the above-mentioned first memory element is a capacitor.

In the above-mentioned magnetic sensor in accordance with the present invention from another aspect, the above-mentioned second memory element is a capacitor.

By using a capacitor as a memory element, a magnetic field sensor which is compact and suitable for integration can be achieved.

The above-mentioned magnetic sensor in accordance with the present invention from another aspect further comprises a judgment circuit which receives a signal of said output switch terminal and outputs a signal of judgment result of the signal value of the second period and the fourth period.

In the above-mentioned magnetic sensor in accordance with the present invention from another aspect, the above-mentioned judgment circuit comprises a first flip-flop circuit which receives the signal of said comparator output terminal at its D input terminal and receives a first clock signal at its clock input terminal, and which holds the signal in said second period and outputs the signal to its Q output terminal, a NOR logic circuit which receives the output signal of said comparator terminal and the output signal of the Q output terminal of said first flip-flop circuit at its input terminal pair respectively and outputs an NOR logic output, and a second flip-flop circuit which receives an output of said NOR logic circuit at its D input terminal and receives a second clock signal at its clock input terminal, and which holds the signal in said fourth period and outputs the signal to its output terminal, wherein the above-mentioned judgment circuit outputs a signal from the second flip-flop circuit output terminal.

In the above-mentioned magnetic sensor in accordance with the present invention from another aspect, the above-mentioned judgment circuit comprises a first flip-flop circuit which receives the signal of said comparator output terminal at its D input terminal and receives a first clock signal at its clock input terminal, and which holds the signal in said second period and outputs the signal to its Q output terminal, a second flip-flop circuit which receives the signal of said comparator output terminal at its D input terminal and receives a second clock signal at its clock input terminal, and which holds the signal in said fourth period and outputs the signal to its output terminal, and a NOR logic circuit which receives the Q outputs of said first flip-flop circuit and said second flip-flop circuit at its input terminal pair respectively and outputs a NOR logic output, wherein the above-mentioned judgment circuit outputs the NOR logic output.

By comprising a judgment circuit which inputs the signal of the switch output signal, and which outputs the signal which judged the signal value of the second period and the fourth period of the signal applied from the outside, existence of a signal can be judged whether the polarity of the magnetic field is a north pole or a south pole.

In the above-mentioned magnetic sensor in accordance with the present invention from another aspect, the above-mentioned first switch part comprises a first voltage terminal which outputs a first voltage, a second voltage terminal which outputs a second voltage, a first input terminal, a second input terminal, a third input terminal, and a fourth input terminal, a first output terminal and a second output terminal, a first switch element connected between the first voltage terminal and the first input terminal, and which performs an open/close operation corresponding to the external signal, a second switch element connected between the first voltage terminal and the second input terminal, and which performs an open/close operation corresponding to the external signal, a third switch element connected between the second voltage terminal and the third input terminal, and which performs an open/close operation corresponding to the external signal, a fourth switch element connected between the second voltage terminal and the fourth input terminal, and which performs an open/close operation corresponding to the external signal, a fifth switch element connected between the first output terminal and the first input terminal, and which performs an open/close operation corresponding to the external signal, a sixth switch element connected between the first output terminal and the second input terminal, and which performs an open/close operation corresponding to the external signal, a seventh switch element connected between the second output terminal and the third input terminal, and which performs an open/close operation corresponding to the external signal, and an eighth switch element connected between the second output terminal and the fourth input terminal, and which performs an open/close operation corresponding to the external signal, wherein one end of the above-mentioned first terminal pair of the magnetoelectric element is connected to the above-mentioned first input terminal, one end of the above-mentioned second terminal pair of the magnetoelectric element is connected to the above-mentioned second input terminal, the other end of the above-mentioned first terminal pair of the magnetoelectric element is connected to the above-mentioned third input terminal, and the other end of the above-mentioned second terminal pair of the magnetoelectric element is connected to the above-mentioned fourth input terminal.

In the above-mentioned magnetic sensor in accordance with the present invention from another aspect, the above-mentioned first, third, sixth and eighth switch elements close in the first period and the fourth period, while said second, fourth, fifth and seventh elements close during the second period and the third period.

Configuring the first switch part from eight switch elements, and interchanging the two sets of output terminal pair of the magnetoelectric element during the first period and the fourth period and during the second period and the third period. By such configuration, an offset signal component of the magnetoelectric element can be cancelled.

In the above-mentioned magnetic sensor in accordance with the present invention from another aspect, the above-mentioned magnetoelectric element is a Hall element.

In the above-mentioned magnetic sensor in accordance with the present invention from another aspect, the above-mentioned magnetoelectric element is a magnetic resistance element.

In the above-mentioned magnetic sensor in accordance with the present invention from another aspect, a signal generator which outputs a signal to the above-mentioned first switch part for determining the above-mentioned first, second, third and fourth period.

By using a Hall element or a magnetic resistance as a magnetoelectric element, a magnetic field sensor which is compact and suitable for integration can be achieved.

The novel features of the invention are set forth with particularity in the appended claims. The invention as to both structure and content, and other objects and features thereof will best be understood from the detailed description when considered in connection with the accompanying drawings.

Part or all of the drawings are drawn schematically for diagrammatic representation and it should be considered that they do not necessarily reflect relative size and position of components shown therein.

DETAILED DESCRIPTION OF THE INVENTION

Embodiments that specifically show the best mode for conducting the present invention will be described below with reference to figures.

First Embodiment

A magnetic field sensor in accordance with the first embodiment of the present invention will be described with reference to FIG. 1 and FIG. 2.

Figure 1:
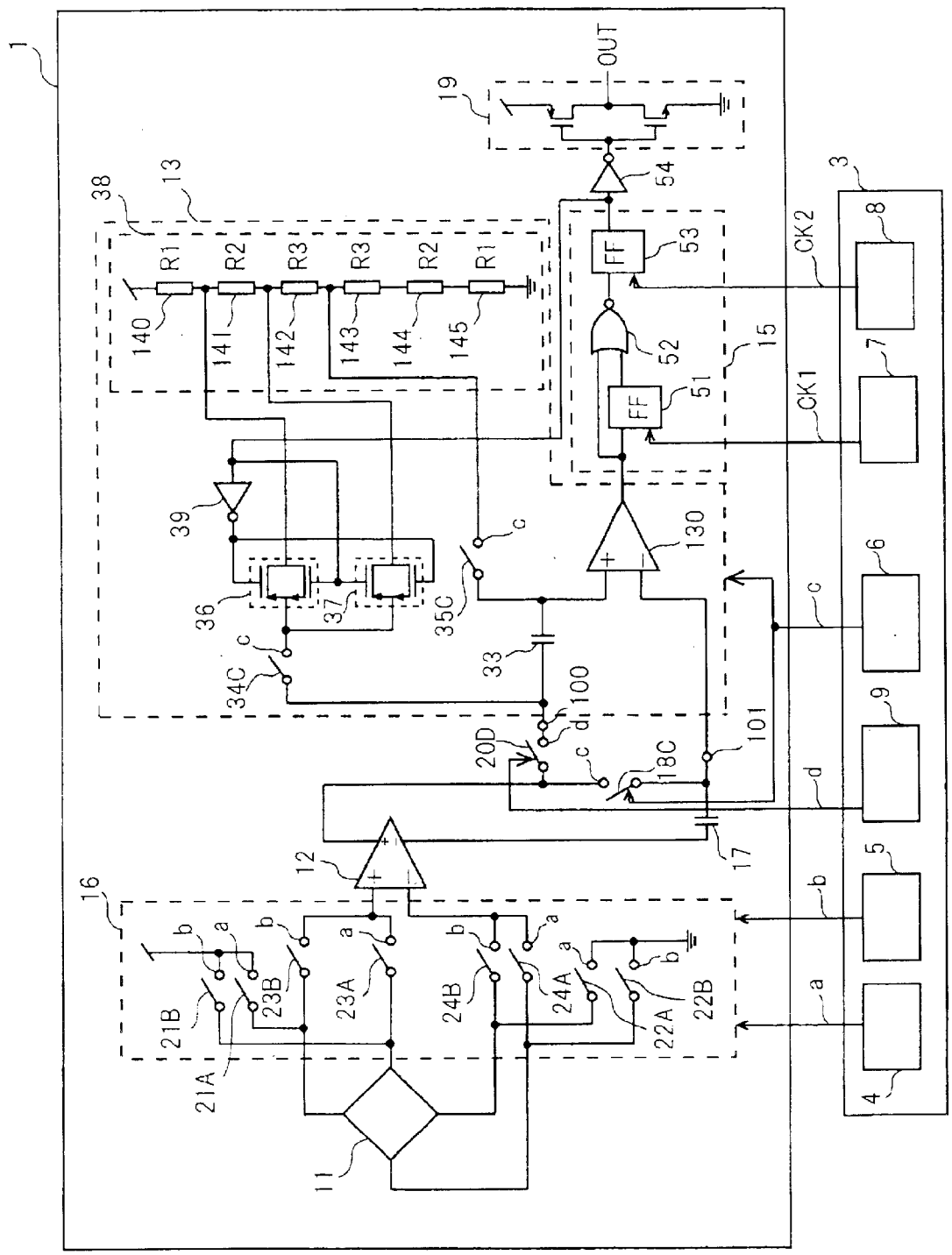
FIG. 1 is a block diagram showing a configuration of a device for detecting magnetic field in accordance with the first embodiment of the present invention.

FIG. 1 is a block diagram showing a configuration of a device for detecting magnetic field in accordance with the first embodiment of the present invention. In FIG. 1, a reference numeral 1 denotes a magnetic field sensor in accordance with the first embodiment, and reference numeral 3 denotes a signal generator.

A signal generator 3 has a first selecting signal generator 4, a second selecting signal generator 5, a third selecting signal generator 6, a fourth signal operator 9, a first clock signal generator 7, and a second clock signal generator 8. The signal generator 3 can be configured with a microcomputer. The first selecting signal generator 4 outputs a first selecting signal a, the second selecting signal generator 5 outputs a first selecting signal b, the third selecting signal generator 6 outputs a first selecting signal c, the fourth selecting signal generator 9 outputs a first selecting signaled. The first clock signal generator 7 and the second clock signal generator 8 outputs a first clock signal CK1 and a second clock signal CK2, respectively. The four selecting signals and the two clock signals are generated corresponding to a timing chart shown in FIG. 2.

In regard to the magnetic field sensor 1, a reference numeral 11 designates a magnetoelectric element, a reference numeral 12 designates a voltage amplifier, a reference numeral 17 designates a first memory element, a reference numeral 16 designates a switch circuit (a first switch part), a reference numeral 13 designates a Schmitt trigger circuit, a reference numeral 15 designates a logic latch circuit (a judging circuit), a reference numeral 54 designates a inverter, and a reference numeral 19 designates a second inverter. In regard to the first embodiment, the magnetoelectric element is a Hall element.

The switch circuit 16 has eight switches 21A, 21B, 22A, 22B, 23A, 23B, 24A and 24B. A power supply voltage is applied to one end of the terminal pair of the magnetoelectric element 11 via the switch circuit 16, and the other end of the terminal pair is grounded. At this point, the signal voltage which generates at the other terminal pair is applied to the input terminal of the voltage amplifier 12.

More specifically, one end of the first switch 21A (a first switch element) is connected to a first external terminal which is located at the first vertical angle of the four vertical angles of the magnetoelectric element 11, and the other end is connected with the input terminal of the power supply voltage, wherein the first switch 21A synchronizes to the first selecting signal a and turns into a closed state. One end of the second switch 21B (a second switch element) is connected to a second external terminal which is located adjacent to the first vertical angle of the magnetoelectric element 11, and the other end is connected with the input terminal of the power supply voltage, wherein the second switch 21B synchronizes to the second selecting signal b and turns into a closed state. One end of the third switch 22A (a third switch element) is connected to a third external terminal which is located opposite to the first vertical angle of the magnetoelectric element 11, and the other end is connected with the ground terminal, wherein the third switch 22A synchronizes to the first selecting signal a and turns into a closed state. One end of the fourth switch 22B (a fourth switch element) is connected to a fourth external terminal which is located opposite to the second vertical angle of the magnetoelectric element 11, and the other end is connected with the ground terminal, wherein the fourth switch 22B synchronizes to the second selecting signal b and turns into a closed state.

One end of the fifth switch 23A (a fifth switch element) is connected to a second external terminal of the magnetoelectric element 11, and the other end is connected with a non-inverting input terminal of the voltage amplifier 12, wherein the fifth switch 23A synchronizes to the first selecting signal a and turns into a closed state. One end of the sixth switch 23B (a sixth switch element) is connected to a first external terminal of the magnetoelectric element 11, and the other end is connected with a non-inverting input terminal of the voltage amplifier 12, wherein the sixth switch 23B synchronizes to the second selecting signal b and turns into a closed state. One end of the seventh switch 24A (a seventh switch element) is connected to a fourth external terminal of the magnetoelectric element 11, and the other end is connected with an inverting input terminal of the voltage amplifier 12, wherein the seventh switch 24A synchronizes to the first selecting signal a and turns into a closed state. One end of the eighth switch 24B (an eighth switch element) is connected to a third external terminal of the magnetoelectric element 11, and the other end is connected with an inverting input terminal of the voltage amplifier 12, wherein the eighth switch 24B synchronizes to the second selecting signal b and turns into a closed state.

Under such configuration, when the first selecting signal a is in a High period, switch 21A and switch 22A is conducted, one end of switch 23A is connected to the non-inverting input terminal of the voltage amplifier 12, and one end of switch 24A is connected to the inverting input terminal of the voltage amplifier 12. When the second selecting signal b is in the High period, switch 21B and switch 22B is conducted, one end of switch 23B is connected to the non-inverting input terminal of the voltage amplifier 12, and one end of switch 24B is connected to the inverting input terminal of the voltage amplifier 12. The polarity of the voltage applied across the input terminals of the voltage amplifier becomes mutually of opposite polarity during when the first selecting signal a is in a High period and during when the second selecting signal b is in a High period.

One end of the switch 18C (the second switch part) and one end of the switch 20D (the fifth switch part) are connected to the non-inverting output terminal of the voltage amplifier 12, and the other end of the switch 18C is connected to one end of the first memory element 17 and the terminal 101. The other end of the first memory element 17 is connected to the inverted output terminal of the voltage amplifier 12. The other end of the switch 20D is connected to the output terminal 100, and the voltage across the output terminal 100 and the output terminal 101 is applied to the Schmitt trigger circuit 13. Switch 18C synchronizes to the third selecting signal c and turns into a closed state. Switch 20D synchronizes to the fourth selecting signal d and turns into a closed state.

The Schmitt trigger circuit 13 has a comparator 130, a second memory element 33, a switch 34C (a third switch part), a switch 35C (a fourth switch part), a first MOS switch 36, a second MOS switch 37, a voltage source 38 and a first inverter 39.

One end of the second memory element 33 (one electrode) is connected to the terminal 100, and the other end (the other electrode) is connected to the non-inverting input terminal of the comparator 130. One end of the switch 34C is connected to one electrode of the second memory element 33, and the other end is connected to one end of the first MOS switch 36 and the second MOS switch 37, wherein the switch 34C synchronizes to the third selecting signal c and turns into a closed state. One end of the switch 35C is connected to the other electrode of the second memory element 33 and the non-inverting input terminal of the comparator 130, and the other end is connected to a setting voltage source 38 of the hysteresis value (set magnetic field), wherein the switch 35C synchronizes to the third selecting signal c and turns into a closed state.

One end of the first MOS switch 36 and the second MOS switch 37 is connected to the other end of the switch 34C, and the other end is each connected to a different terminal of the setting voltage source 38. The output voltage of the terminal of the setting voltage source 38 to which the other end of the first MOS switch 36 is connected, is higher than the output voltage of the terminal of the setting voltage source 38 to which the second MOS switch 37 is connected, and the output voltage of the terminal of the setting voltage source 38 to which the other end of the switch 35C is connected, is lower than the output voltage of the terminal of the setting voltage source 38 to which the other end of the second MOS switch 37 is connected.

The inverting input terminal of the comparator 130 is connected to the terminal 101. The output terminal of the comparator 130 becomes the output terminal of the Schmitt trigger circuit 13.

The input terminal of the first inverter 39 is connected to the output terminal of the logic latch circuit 15 (judgment circuit), and its output terminal is connected to a gate electrode of a PMOS of the first MOS switch 36 and connected also to a gate electrode of a NMOS of the second MOS switch 37. The gate electrode of a NMOS of the first MOS switch 36 and the gate electrode of a PMOS of the second MOS switch 37 are connected to the output terminal of the logic latch circuit 15.

The logic latch circuit 15 is configured with a first flip-flop circuit 51 wherein a D-input terminal is connected to the output terminal of the comparator 130, and receives the first clock signal CK1 at the clock terminal, a two-input NOR logic circuit 52 wherein one input terminal receives an output signal from the comparator 130 and the other input terminal receives an output signal from the first flip-flop circuit 51, and a second flip-flop circuit 53 wherein a D-input terminal receives the output signal from the NOR logic circuit 52, and receives the a second clock signal CK2 at the clock terminal. The output terminal of the second flip-flop circuit 53 becomes the output terminal of the logic latch circuit 15.

A second inverter 19, as an output buffer receiving the output signal of the flip-flop circuit 53 via inverter 54, is connected to the latter part of the logic latch circuit 15. The output terminal of the second inverter 19 becomes the output terminal of the magnetic field sensor 1.

In regard to the first embodiment, the first memory element 17 and the second memory element 33 is a capacitor. Hereinafter, the first memory element 17 and the second memory element 33 will be described as capacitor 17 and capacitor 33, respectively.

In the following, the operation of the magnetic field sensor configured as above-mentioned is described.

Figure 2:
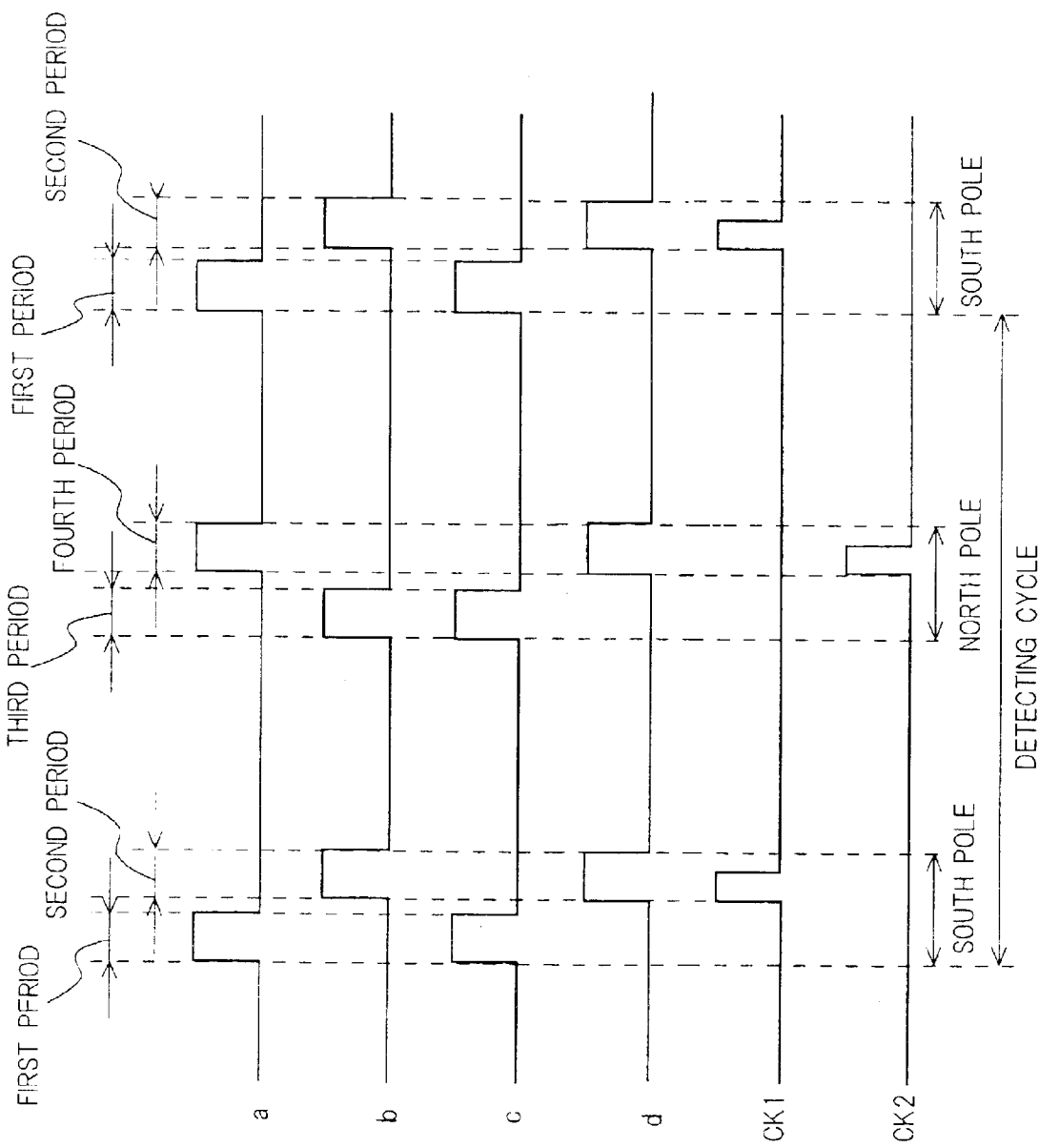
FIG. 2 is a timing chart of a synchronizing signal applied to a device for detecting magnetic field in accordance with the first embodiment and the second embodiment of the present invention.

FIG. 2 is a timing chart of a synchronizing signal applied to the magnetic field sensor in accordance with the first embodiment of the present invention. In FIG. 2, a status wherein the first selecting signal a is High, the second selecting signal b is Low, the third selecting signal c is High, is treated as the first period, and the fourth selecting signal d is Low, is treated as the first period. A status wherein the first selecting signal a is Low, the second selecting signal b is High, the third selecting signal c is Low, and the fourth selecting signal d is High, is treated as the second period. A status wherein the first selecting signal a is Low, the second selecting signal b is High, the third selecting signal c is High, and the fourth selecting signal d is Low, is treated as the third period. A status wherein the first selecting signal a is High, the second selecting signal b is Low, the third selecting signal c is Low, and the fourth selecting signal d is High, is treated as the fourth period.

In the first period, switch 21A, switch 22A, switch 23A, switch 24A, switch 18C, switch 34C, and switch 35C is conducted. During the first period, switch 21A and switch 22A is conducted and an electric potential is applied to the magnetoelectric element 11, and switch 23A and switch 24A is conducted and applies the output signal of the magnetoelectric element 11 to the input terminal pair of the voltage amplifier 12. The voltage applied to the input terminal pair of the voltage amplifier 12 in the first period is a sum of the effective signal component and the offset signal component of the magnetoelectric element 11. Since switch 18C is closed by the third selecting signal c, and switch 20D is opened by the fourth selecting signal d, the signal voltage amplified at the voltage amplifier 12 is applied to both ends of the capacitor 17.

On the other hand, the voltage of the voltage source 38 is applied to each terminal of the capacitor 33, since switch 34C and switch 35C is closed. The voltage source 38 outputs a voltage wherein the power source voltage is divided by resistance 140, 141, 142, 143, 144 and 145. The voltage of a joint part of resistance 142 and resistance 143 is applied to the other end of switch 35C. A voltage is applied to the other end of switch 34C via the first MOS switch 36 or the second MOS switch 37. When the voltage of the input part of the first inverter 39 is High, the first MOS switch 36 is conducted, and when the voltage of the input part of the first inverter 39 is Low, the second MOS switch 37 is conducted. When the first MOS switch 36 is conducted, the voltage of a joint part of the resistance 140 and the resistance 141 is applied to switch 34C. When the second MOS switch 37 is conducted, the voltage of a joint part of the resistance 141 and the resistance 142 is applied to switch 34C. A predetermined voltage is applied to both ends of the capacitor 33 in such manner. The voltage applied to both ends of the capacitor 33 is equivalent to the threshold value for detecting the strength of the detected magnetic field.

In the second period, switch 21A, switch 22A, switch 23A, switch 24A, switch 18C, switch 34C, and switch 35C is in open state. Switch 21B and switch 22B is conducted and an electric potential is applied to the magnetoelectric element 11. Switch 23B and switch 24B is conducted and the output signal of the magnetoelectric element 11 is applied to the input terminal pair of the voltage amplifier 12. On the other hand, the signal voltage amplified at the voltage amplifier 12 is applied to both end of the series connection of the capacitor 17 and the capacitor 33, since the switch 18C is opened by the third selecting signal c, and the switch 20D is closed by the fourth selecting signal d.

The polarity of the effective signal component applied to the input terminal pair of the voltage amplifier 12 in the second period is of opposite polarity to the polarity of the effective signal component applied to the input terminal pair of the voltage amplifier 12 in the first period. On the other hand, the polarity of the offset signal component of the magnetoelectric element 11 is the same in the first period and in the second period.

When switch 18C is opened, the relative voltage of the joint part of the capacitor 17 and the inverting output terminal of the voltage amplifier 12 against the voltage of the joint part (terminal 101) of switch 18C and the capacitor 17 is assumed to be a positive value. Further in this state, the polarity of the relative voltage of the non-inverting output terminal of the voltage amplifier 12 against the inverting output terminal is outputted as a positive value. Therefore, the signal of the first period and the signal of the second period is added and outputted across the terminal 100 and the terminal 101 in the second period. The voltage of the terminal 100 is higher than the voltage of the terminal 101.

When the offset voltage of the voltage amplifier 12 regularly exists in the voltage which is extracted from the output terminal pair by amplifying the voltage of the input terminal pair of the voltage amplifier 12, the offset voltage across the ends of switch 18C in the first period and the second period becomes a mutually opposite polarity. The output voltage across the terminal 100 and the terminal 101 in the second period does not include the offset voltage, since the offset voltage component is substantially cancelled. The offset signal component of the magnetoelectric element 11 which is applied to the input terminal pair of the voltage amplifier 12, has the same polarity in the first period and the second period. In across the output terminal 100 and the output terminal 101, the offset signal component of the magnetoelectric element 11 has an opposite polarity in the first period and the second period. The output voltage across the terminal 100 and the terminal 101 in the second period does not include the offset voltage, since the offset voltage component is substantially cancelled.

In such manner, the offset voltage component contained in the magnetoelectric element 11 and the voltage amplifier 12 regarding the output voltage across the terminal 100 and the terminal 101 in the second period is cancelled, and the effective signal component doubles.

Subsequently, a voltage which deducted the voltage of both ends of the capacitor 33 (threshold) from the sum of the output voltage of the voltage amplifier 12 and the voltage of the capacitor 17, is applied to the input terminal pair of the comparator 130.

When the voltage value applied to the comparator 130 (the voltage value which deducted the voltage of the inverting input terminal from the voltage of the non-inverting input terminal) is equal to or more than zero (e.g., when a magnetic field of a south polarity with a strength which is equal or more than the threshold value is detected), the comparator 130 outputs a High value which is one of the value of a binary voltage. In the first period, the voltage of both ends of the capacitor 33 (a voltage which deducted the voltage of the inverting input terminal from the voltage of the non-inverting input terminal of the comparator 130) is a negative value, and the output of the comparator 130 is Low.

In the third period, switch 21B, switch 22B, switch 23B, switch 24B, switch 18C, switch 34C, and switch 35C is conducted. Likewise as in the second period, switch 21B and switch 22B is conducted and an electric potential is applied to the magnetoelectric element 11. Switch 23B and switch 24B is conducted and the output signal of the magnetoelectric element 11 is applied to the input terminal pair of the voltage amplifier 12. The signal voltage amplified at the voltage amplifier 12 is applied to both ends of the capacitor-17, since the switch 18C is closed by the third selecting signal c, and the switch 20D is opened by the fourth selecting signal d.

In the fourth period, switch 21B, switch 22B, switch 23B, switch 24B, switch 18C, switch 34C, and switch 35C is in open state. Likewise as in the first period, switch 21A and switch 22A is conducted and an electric potential is applied to the magnetoelectric element 11. Switch 23A and switch 24A is conducted and the output signal of the magnetoelectric element 11 is applied to the input terminal pair of the voltage amplifier 12. The signal voltage amplified at the voltage amplifier 12 is applied to the both ends of the series connection of the capacitor 17 and the capacitor 33, since the switch 18C is opened by the third selecting signal c, and the switch 20D is closed by the fourth selecting signal d.

The polarity of the effective signal component applied to the input terminal pair of the voltage amplifier 12 in the fourth-period is of opposite polarity to the polarity of the effective signal component applied to the input terminal pair of the voltage amplifier 12 in the third period. On the other hand, the polarity of the offset signal component of the magnetoelectric element 11 is the same in the third period and in the fourth period.

The polarity of the signal applied to the voltage amplifier 12 in the first period and the second period, and the polarity of the signal applied in the third period and the fourth period are mutually in opposite polarities. When the voltage of the terminal 100 is lower than the voltage of the terminal 101 in the second period, the voltage of the terminal 100 is higher than the voltage of the terminal 101 in the fourth period. When the input voltage value is equal to or more than zero, the comparator 130 outputs a High value in the fourth period. When a magnetic field of south polarity is detected in the second period, a magnetic field of north polarity is detected in the fourth period. By substantially shortening the time from the first period to the fourth period (detecting cycle) compared to the fluctuation cycle of the detected magnetic field which is the detecting target, it becomes capable of judging whether the magnetic field strength of the detected magnetic field is larger than the predetermined value or not. The magnetic field sensor in accordance to the first embodiment is capable to judge whether the magnetic field strength of the detected magnetic field is larger than the predetermined value or not, regardless of the polarity of the detected magnetic field.

The output of the comparator 130 is applied to the logic latch circuit 15. A first clock signal CK1 and a second clock signal CK2 for latching the output signal of the comparator 130 during the second period and the fourth period, is applied respectively to the logic latch circuit 15. The logic latch circuit 15 latches the input signal at the fall down of the clock signals.

First of all, a value corresponding to the output state of the comparator 130 is stored in the Q-output of the first flip-flop circuit 51 by the first clock signal CK1. The Q-output signal and the output signal of the comparator 130 is applied to the NOR logic circuit 52. When both of the values is Low, the output of the NOR logic circuit 52 is High. The output of the NOR logic circuit 52 is holded in the output of the second flip-flop circuit 53 by the second clock signal CK2.

When the output of the comparator 130 is High in either the second period or the fourth period, the Q-output signal of the second flip-flop circuit 53 is Low. When the output of the comparator 130 is Low in both the second period and the fourth period, the Q-output signal of the second flip-flop circuit 53 is High. The Q-output signal of the second flip-flop circuit 53 is extracted as the output signal of the logic latch circuit 15.

The output signal of the logic latch circuit 15 is applied to the input part of the inverter 54, the input part of the first inverter 39 within the Schmitt trigger circuit 13, gate electrode of a NMOS of the first MOS switch 36 and the gate electrode of a PMOS of the second MOS switch 37. The output signal of the inverter 54 is applied to the input part of the second inverter 19.

When the output of the logic latch circuit 15 is High, the current drive signal leading to the outside from the output part of the second inverter 19 is extracted. When the output of the logic latch circuit 15 is Low, a current signal leading to the output part of the second inverter 19 from the outside is applied.

Furthermore, when the output of the logic latch circuit 15 is High, the voltage of the input part of the first inverter 39 becomes High, the first MOS switch 36 is conducted, and a voltage of the joint part of the resistance 140 and the resistance 141 is applied to the other end of the switch 34C which is connected with the first MOS switch 36. When the output of the logic latch circuit 15 is Low, the voltage of the input part of the first inverter 39 becomes Low, the second MOS switch 37 is conducted, and a voltage of the joint part of resistance 141 and the resistance 142 is applied to the other end of the switch 34C which is connected with the second MOS switch 37.

Hence it follows that when no magnetic field (or a magnetic flux) is detected from neither the second period nor the fourth period, the voltage of the joint part of the resistance 140 and the resistance 141 is applied to one end of the capacitor 33, and when a magnetic field (or a magnetic flux) is detected from either the second period or the fourth period, the voltage of the joint part of the resistance 141 and the resistance 142 is applied to one of the capacitor 33. By differentiating the voltage value applied to one of the capacitor 33 corresponding to the output signal in such manner, it is possible to make the comparison level of the comparator 130 have a hysteresis.

A device for detecting magnetic field in accordance with the first embodiment can output a binary value representing whether the strength of the detected magnetic field is larger than the predetermined value or not, regardless of the polarity of the detected magnetic field.

A device for detecting magnetic field in accordance with the first embodiment applies a high hysteresis voltage to the comparator 130 when a magnetic field is not detected, and applies a low hysteresis voltage to the comparator 130 once a magnetic field is detected. Therefore, a magnetic field can be detected stably.

A device for detecting magnetic field in accordance with the first embodiment has only one voltage comparator, and therefore its electric current consumption is small, and its circuit scale is small.

Second Embodiment

Figure 3:
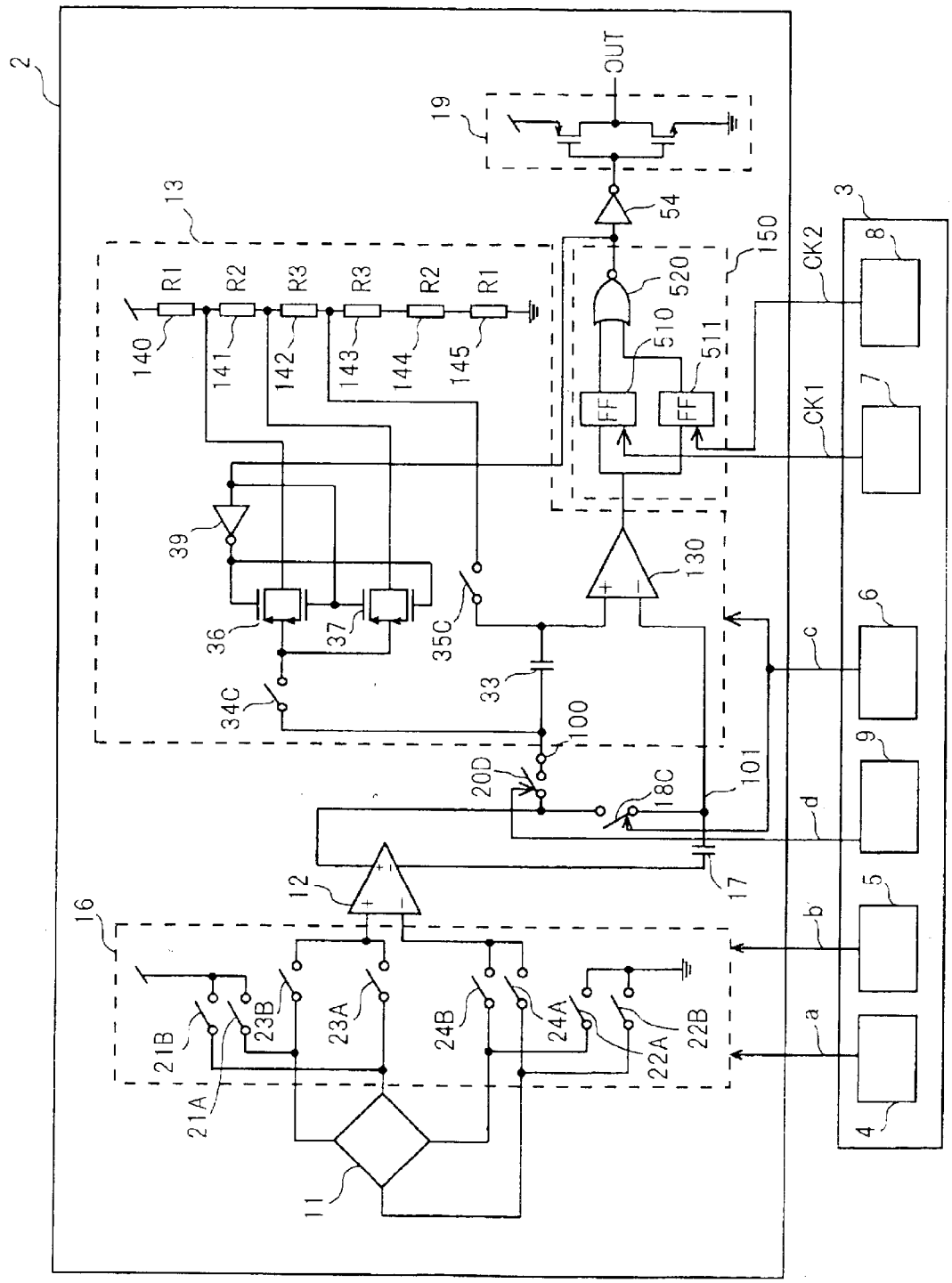
FIG. 3 is a block diagram showing a configuration of a device for detecting magnetic field in accordance with the second embodiment of the present invention.
Figure 4:
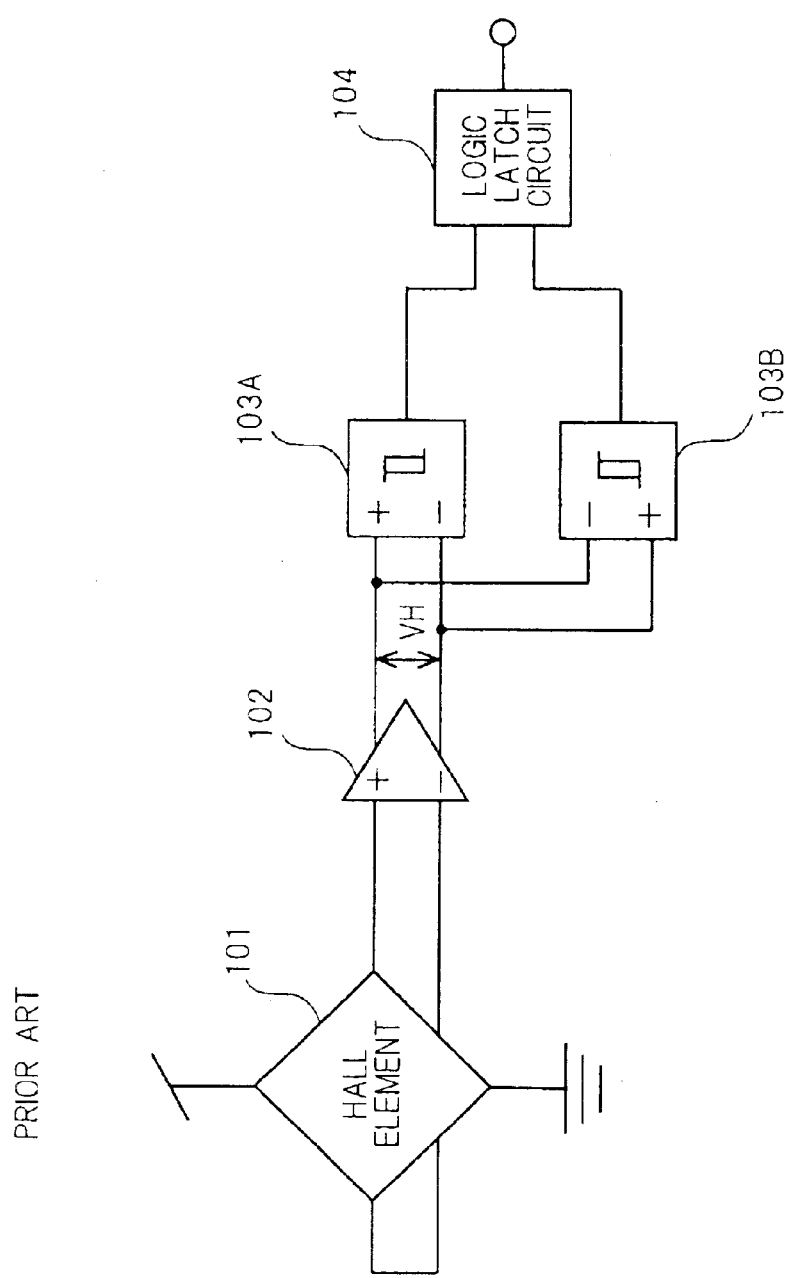
FIG. 4 is a configuration diagram showing a conventional magnetic field strength judgment circuit corresponding to the magnetic field of both polarities.

FIG. 3 is a block diagram showing a configuration of a device for detecting magnetic field in accordance with the second embodiment of the present invention. The device for detecting magnetic field in accordance with the second embodiment is a device wherein the magnetic field sensor 1 is replaced to a magnetic field sensor 2. The magnetic field sensor 2 in accordance with the second embodiment is a device wherein the logic latch circuit 15 of the magnetic field sensor 1 (FIG. 1) in accordance with the first embodiment is replaced to a logic latch circuit 150. The magnetic field sensor 2 in accordance with the second embodiment is the same with the magnetic field sensor 1 in first embodiment in regard to other respects. A same reference numeral will be appended in FIG. 3 to the block which is the same as the first embodiment, and its description will be omitted.

The output part of the comparator 130 of the Schmitt trigger circuit 13 is connected to a D-input terminal of the first flip-flop circuit 510 and the second flip-flop circuit 511. A first clock signal CK1 is applied to the clock input terminal of the first flip-flop circuit 510. Also, a second clock signal CK2 is applied to the clock input terminal of the second flip-flop circuit 511. Each Q-output signal of the first flip-flop circuit 510 and the second flip-flop circuit 511 is applied to the NOR logic circuit 520. When the signals detected at the first clock signal CK1 and the second clock signal CK2 are both Low, the output of the logic latch circuit 150 is High. When either of the signals detected at the first clock signal CK1 and the second clock signal CK2 is High, the output of the logic latch circuit 150 is Low.

The device for detecting magnetic field in accordance with the second embodiment has the same effect as that of the device for detecting magnetic field in accordance with the first embodiment.

The magnetoelectric element 11 in the first embodiment and the second embodiment was a Hall element, but a magnetic resistance or a magnetoelectric element besides the above will do as well.

In regard to the magnetic field sensor 1 in accordance with the first embodiment and the magnetic field sensor 2 in accordance with the second embodiment, configurations as to provide the magnetoelectric element 11 and the second inverter 19 at the outside of the magnetic field sensor will do as well.

According to the magnetic field sensor in regard to the present invention, the magnetic field sensor can correspond to the magnetic field of both polarities regardless of the polarity of the magnetic field with one voltage comparator, and can detect the magnetic field strength with a simple configuration and also reduce the electric current consumption.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A magnetic field sensor comprising:
    a first switch part which receives a signal corresponding to a signal of a magnetoelectric element in an applied magnetic field, and which outputs an output signal so that a polarity of the output signal in a first period and a fourth period are each opposite to a polarity of the output signal in a second period and a third period,
    an amplifier which amplifies the output signal of the first switch part and outputs an output signal to its output terminal pair,
    a first memory element of which both ends are connected to said output terminal pair of the amplifier,
    a second switch part connected between one of said output terminal pair and one terminal of said first memory element, and which closes in synchronization to said first period and said third period and opens in synchronization to said second period and said fourth period, and
    an output switch terminal which outputs a signal of a first polarity in the second period, and which outputs a signal of an opposite polarity to said first polarity in the fourth period.

2. A magnetic field sensor comprising:
    a magnetoelectric element which has a first terminal pair and a second terminal pair and which outputs a signal corresponding to an applied magnetic field,
    a first switch part which receives a signal of the first terminal pair and a signal of the second terminal pair of the magnetoelectric element and at least one external signal which determines a first period, a second period, a third period and a fourth period, and which outputs a signal of said first terminal pair of the magnetoelectric element in the first period and the fourth period, and outputs a signal of said second terminal pair of the magnetoelectric element in the second period and the third period,
    an amplifier which amplifies the output signal of the first switch part and outputs a signal to its output terminal pair,
    a first memory element of which both ends are connected to said output terminal pair of the amplifier,
    a second switch part connected between one of said output terminal pair and one terminal of said first memory element, and which closes in synchronization to the first period and the third period and opens in synchronization to the second period and to the fourth period, and
    an output switch terminal which outputs at least one of the signals at the ends of said second switch part.

3. A magnetic field sensor in accordance with claim 1 or 2, wherein said second switch part comprises an output terminal pair.

4. A magnetic field sensor in accordance with claim 1 or 2, wherein the magnetic field sensor further comprises a comparator, which receives the signal of said output switch terminal, and outputs a result of comparison with a predetermined value.

5. A magnetic field sensor in accordance with claim 4, wherein a different voltage is appended to the signal of said output switch terminal, corresponding to the output signal of said comparator.

6. A magnetic field sensor in accordance with claim 1 or 2, wherein one end of said second switch part is connected to one of the input terminal pair of the comparator, and the other end of said second switch part is connected to the other said input terminal pair of the comparator via a second memory element.

7. A magnetic field sensor in accordance with claim 6, wherein the magnetic sensor further comprises
    a third switch part, one end of which is connected to one end of said second memory element,
    a fourth switch part, one end of which is connected to the other end of said second memory element,
    a first voltage source which applies a first voltage to the other end of said third switch part, and
    a second voltage source which applies a voltage different from said first voltage to the other end of said fourth switch part, wherein
    said third switch part and the fourth switch part are closed in said first and fourth period.

8. A magnetic field sensor in accordance with claim 7, wherein either one of said first voltage or said second voltage is changed corresponding to said external signal.

9. A magnetic field sensor in accordance with claim 1 or 2, wherein said first memory element is a capacitor.

10. A magnetic field sensor in accordance with claim 7, wherein said second memory element is a capacitor.

11. A magnetic field sensor in accordance with claim 1 or 2, further comprising a judgment circuit which receives a signal of said output switch terminal and outputs a signal of judgment result of the signal value of the second period and the fourth period.

12. A magnetic field sensor in accordance with claim 11, wherein said judgment circuit comprises:
    a first flip-flop circuit which receives the signal of said comparator output terminal at its D input terminal and receives a first clock signal at its clock input terminal, and which holds the signal in said second period and outputs the signal to its Q output terminal,
    a NOR logic circuit which receives the output signal of said comparator terminal and the output signal of the Q output terminal of said first flip-flop circuit at its input terminal pair respectively and outputs an NOR logic output, and a second flip-flop circuit which receives an output of said NOR logic circuit at its D input terminal and receives a second clock signal at its clock input terminal, and which holds the signal in said fourth period and outputs the signal to its output terminal, wherein said judgment circuit outputs a signal from the second flip-flop circuit output terminal.

13. A magnetic field sensor in accordance with claim 11, wherein said judgment circuit comprises:

a first flip-flop circuit which receives the signal of said comparator output terminal at its D input terminal and receives a first clock signal at its clock input terminal, and which holds the signal in said second period and outputs the signal to its Q output terminal, a second flip-flop circuit which receives the signal of said comparator output terminal at its D input terminal and receives a second clock signal at its clock input terminal, and which holds the signal in said fourth period and outputs the signal to its output terminal, and a NOR logic circuit which receives the Q outputs of said first flip-flop circuit and said second flip-flop circuit at its input terminal pair respectively and outputs a NOR logic output, wherein said judgment circuit outputs the NOR logic output.

14. A magnetic field sensor in accordance with claim 1 or 2, wherein said first switch part comprises a first voltage terminal which outputs a first voltage, a second voltage terminal which outputs a second voltage, a first input terminal, a second input terminal, a third input terminal, and a fourth input terminal, a first output terminal and a second output terminal, a first switch element connected between the first voltage terminal and the first input terminal, and which performs an open/close operation corresponding to the external signal, a second switch element connected between the first voltage terminal and the second input terminal, and which performs an open/close operation corresponding to the external signal, a third switch element connected between the second voltage terminal and the third input terminal, and which performs an open/close operation corresponding to the external signal, a fourth switch element connected between the second voltage terminal and the fourth input terminal, and which performs an open/close operation corresponding to the external signal, a fifth switch element connected between the first output terminal and the first input terminal, and which performs an open/close operation corresponding to the external signal, a sixth switch element connected between the first output terminal and the second input terminal, and which performs an open/close operation corresponding to the external signal, a seventh switch element connected between the second output terminal and the third input terminal, and which performs an open/close operation corresponding to the external signal, and an eighth switch element connected between the second output terminal and the fourth input terminal, and which performs an open/close operation corresponding to the external signal, wherein one end of said first terminal pair of the magnetoelectric element is connected to said first input terminal, one end of said second terminal pair of the magnetoelectric element is connected to said second input terminal, the other end of said first terminal pair of the magnetoelectric element is connected to said third input terminal, and the other end of said second terminal pair of the magnetoelectric element is connected to said fourth input terminal.

15. A magnetic field sensor in accordance with claim 14, wherein said first, third, sixth and eighth switch elements close in the first period and the fourth period, while said second, fourth, fifth and seventh elements close during the second period and the third period.

16. A magnetic field sensor in accordance with claim 1 or 2, wherein said magnetoelectric element is a Hall element.

17. A magnetic field sensor in accordance with claim 1 or 2, wherein said magnetoelectric element is a magnetic resistance element.

18. A device for detecting a magnetic field comprising:

a first selecting-signal generator which generates a first selecting-signal during a first period and a fourth period, a second selecting-signal generator which generates a second selecting-signal during a second period and a third period, a third selecting-signal generator which generates a third selecting-signal during the first period and the third period, a magnetoelectric element which has a first terminal pair and a second terminal pair and which outputs a signal corresponding to an applied magnetic field, a first switch part which receives a signal of the first terminal pair and a signal of the second terminal pair of the magnetoelectric element, and said first selecting-signal and said second selecting-signal respectively, and which outputs a signal of said first terminal pair of the magnetoelectric element in the first period and the fourth period, and outputs a signal of said second terminal pair of the magnetoelectric element in the second period and the third period, an amplifier which amplifies the output signal of the first switch part and outputs a signal to its output terminal pair, a first memory element, both ends of which are connected to said output terminal pair of the amplifier, a second switch part connected between one of said output terminal pair and one terminal of said first memory element, and which receives said third selecting signal, and which closes in the first period and the third period and opens in the second period and the fourth period, a comparator which receives at least one of the voltages at the ends of said second switch part, and which outputs a result of comparison with a predetermined value, and a judgment circuit which outputs a logical sum signal of the output signal of said comparator in the second period and the output signal of said comparator in the fourth period.

19. A method for detecting magnetic field comprising:

a step of receiving a signal corresponding to an applied magnetic field, outputted from a magnetoelectric element, and outputting an output signal so that a polarity of the output signal in a first period and a fourth period opposites to a polarity of the signal during a second period and a third period, an amplifying step of amplifying and outputting the output signal, a holding step of holding the output signal outputted in said amplifying step in a first memory element, in the first period and the third period, an addition step of adding-signal components of an output signal outputted in said amplifying step and the output signal stored in said first memory element, in the second period and the fourth period, a comparison step of receiving the added signal components of said addition step in the second period and the fourth period, and outputting a result of comparison with a predetermined value, and a judgment step of outputting a logical sum of the output signal of said comparison step in the second period and the period.

20. A magnetic field sensor in accordance with claim 1 or 2, further comprising;

a signal generator which outputs a signal to said first switch part for determining said first, second, third and fourth period.

* * * * *